United States Patent
Chae et al.

(10) Patent No.: US 9,564,907 B2
(45) Date of Patent: Feb. 7, 2017

(54) MULTI-CHANNEL DELAY LOCKED LOOP

(71) Applicants: SK hynix Inc., Icheon (KR); SEOUL NATIONAL UNIVERSITY R&DB FOUNDATION, Seoul (KR)

(72) Inventors: Joo-Hyung Chae, Seoul (KR); Suhwan Kim, Seoul (KR); Deog-Kyoon Jeong, Seoul (KR)

(73) Assignees: SK HYNIX INC., Icheon (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 0 days.

(21) Appl. No.: 14/810,900

(22) Filed: Jul. 28, 2015

(65) Prior Publication Data

US 2016/0087638 A1  Mar. 24, 2016

(30) Foreign Application Priority Data

Sep. 18, 2014 (KR) .................. 10-2014-0124056

(51) Int. Cl.
*H03L 7/06* (2006.01)
*H03L 7/07* (2006.01)
*H03L 7/085* (2006.01)
*H03L 7/08* (2006.01)
*H03L 7/081* (2006.01)
*H03L 7/087* (2006.01)

(52) U.S. Cl.
CPC ............ *H03L 7/07* (2013.01); *H03L 7/085* (2013.01); *H03L 7/0805* (2013.01); *H03L 7/087* (2013.01); *H03L 7/0814* (2013.01); *H03L 7/0816* (2013.01)

(58) Field of Classification Search
USPC .................. 327/147–149, 156–158
See application file for complete search history.

(56) References Cited

U.S. PATENT DOCUMENTS

| | | | |
|---|---|---|---|
| 7,072,380 B2 * | 7/2006 | Ozluturk | G06F 13/374 375/141 |
| 7,123,600 B2 * | 10/2006 | Ozluturk | H03H 17/0226 370/320 |
| 7,139,348 B1 | 11/2006 | Fu et al. | |
| 7,161,402 B1 | 1/2007 | Sompur et al. | |
| 2002/0157031 A1 * | 10/2002 | Lin | G11C 7/1078 713/401 |
| 2003/0197537 A1 * | 10/2003 | Saint-Laurent | G06F 1/10 327/165 |
| 2004/0080349 A1 * | 4/2004 | Kawahito | H03L 7/07 327/158 |
| 2004/0239387 A1 * | 12/2004 | Zhang | H03K 5/133 327/158 |
| 2009/0085618 A1 * | 4/2009 | Schneider | H03L 7/07 327/143 |
| 2009/0085623 A1 * | 4/2009 | Schneider | H03L 7/07 327/161 |

(Continued)

*Primary Examiner* — Adam Houston

(57) ABSTRACT

A multi-channel delay locked loop includes a global delay locked loop and a plurality of local delay locked loops. The global delay locked loop is configured to lock an input clock signal and output a global delay control signal corresponding to a delay amount of the input clock signal during a locking operation. Each of the plurality of local delay locked loops is configured to output a channel clock signal by locking the input clock signal, and initialize the delay amount of the input clock signal according to the global delay control signal.

15 Claims, 7 Drawing Sheets

(56) References Cited

U.S. PATENT DOCUMENTS

| | | | |
|---|---|---|---|
| 2009/0285042 A1* | 11/2009 | Chae | G11C 7/1039 365/193 |
| 2012/0126868 A1* | 5/2012 | Machnicki | H03L 7/0814 327/158 |
| 2014/0015573 A1* | 1/2014 | Ross | H03L 7/0812 327/142 |
| 2015/0003176 A1* | 1/2015 | Spinks | G11C 11/4076 365/194 |
| 2016/0034219 A1* | 2/2016 | Jeter | G06F 3/0625 711/154 |
| 2016/0048334 A1* | 2/2016 | Jeter | G06F 3/0604 711/163 |
| 2016/0087638 A1* | 3/2016 | Chae | H03L 7/085 327/158 |
| 2016/0285616 A1* | 9/2016 | Dionne | H04L 7/033 |

\* cited by examiner

MULTI-CHANNEL DELAY LOCKED LOOP

CROSS-REFERENCE TO RELATED APPLICATIONS

The present application claims priority of Korean Patent Application No. 10-2014-0124056, filed on Sep. 18, 2014, which is incorporated herein by reference in its entirety.

BACKGROUND

1. Field

Embodiments of the present invention relate to a delay locked loop, and more particularly, to a multi-channel delay locked loop that includes a global delay locked loop and a plurality of local delay locked loops in order to reduce power consumption while improving a locking speed.

2. Description of the Related Art

In high-speed interfaces such as universal serial bus (USB), peripheral component interconnect express (PCI) Express, and model driven message interoperability (MDMI), as well as memory interface circuits such as a double data rate (DDR) memory interface circuit and a low power double data rate (LPDDR) memory interface circuit, a plurality of channels are generally used to transmit a clock signal or data. Conventionally, an independent delay locked loop has been used for each channel, in order to perform a locking operation.

FIG. 1 is a block diagram illustrating a conventional multi-channel delay locked loop 10.

The conventional multi-channel delay locked loop 10 may include a plurality of delay locked loops (DLLs) 11 which independently operate.

The delay locked loops 11 lock delays between an input clock signal CLKIN and output clock signals CLKOUT1, CLKOUT2, . . . , and CLKOUTN, respectively.

FIG. 2 is a block diagram illustrating the delay locked loop 11 of FIG. 1.

The delay locked loop 11 may include a variable delay line 1, a delay model 2, a phase comparator 3, and a delay line controller 4.

The variable delay line 1 adjusts a delay amount of the input clock signal CLKIN according to a delay control signal DCODE, and outputs the output clock signal, e.g., CLKOUT1. Since the variable delay line 1 may use a well-known variable delay line that adjusts a delay amount according to a delay control signal, detailed descriptions of the variable delay line 1 are omitted herein.

The delay model 2 delays the output clock signal CLKOUT1 by a modeled time, and outputs a feedback clock signal CLKFB. If the input clock signal CLKIN and the output clock signal CLKOUT1 are intended to be set in phase, the delay model 2 may not be required.

The phase comparator 3 compares a phase of the input clock signal CLKIN and a phase of the feedback clock signal CLKFB, and outputs a phase difference signal PD representing a difference between the phase of the input clock signal CLKIN and the phase of the feedback clock signal CLKFB.

The delay line controller 4 outputs the delay control signal DCODE according to the phase difference signal PD.

The delay locked loop 11 constantly locks a delay between the input clock signal CLKIN and the output clock signal CLKOUT1 through the feedback control.

Since the conventional multi-channel delay locked loop 10 includes the plurality of delay locked loops 11 which independently operate for the respective channels, a circuit area and power consumption of the loop 10 are inevitably increased. Furthermore, the multi-channel delay locked loop 10 may require a relatively long time until all of the channels are locked.

SUMMARY

Various embodiments of the present disclosure are directed to a multi-channel delay locked loop which is capable of reducing a circuit area and power consumption while reducing a locking time.

In an embodiment, a multi-channel delay locked loop may include: a global delay locked loop configured to lock an input clock signal and output a global delay control signal corresponding to a delay amount of the input clock signal during a locking operation; and a plurality of local delay locked loops each configured to output a channel clock signal by locking the input clock signal, and initialize the delay amount of the input clock signal according to the global delay control signal.

The global delay locked loop may include: a variable delay line configured to adjust the delay amount of the input clock signal according to the global delay control signal; a phase comparator configured to compare a phase of a feedback clock signal to a phase of the input clock signal, the feedback clock signal being fed back from an output signal of the variable delay line; and a delay line controller configured to control the value of the global delay control signal according to an output of the phase comparator.

The local delay locked loops may include: a local variable delay line configured to adjust the delay amount of the input clock signal according to a local delay control signal; a local phase comparator configured to compare a phase of a second feedback clock signal to a phase of the input clock signal, the second feedback clock signal being fed back from an output signal of the local variable delay line; and a local delay line controller configured to control a value of the local delay control signal according to an output of the local phase comparator.

DETAILED DESCRIPTION

Figure 1:
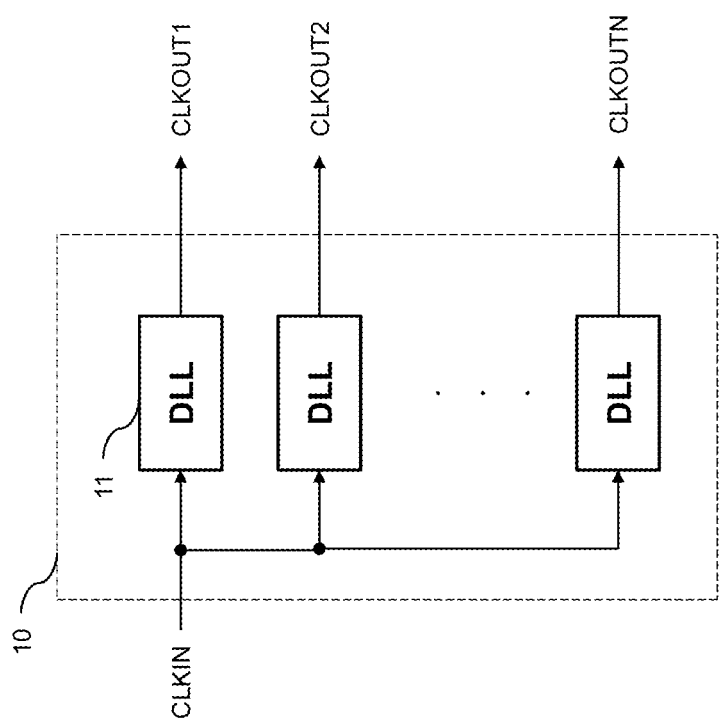
FIG. 1 is a block diagram illustrating a conventional multi-channel delay locked loop.
Figure 2:
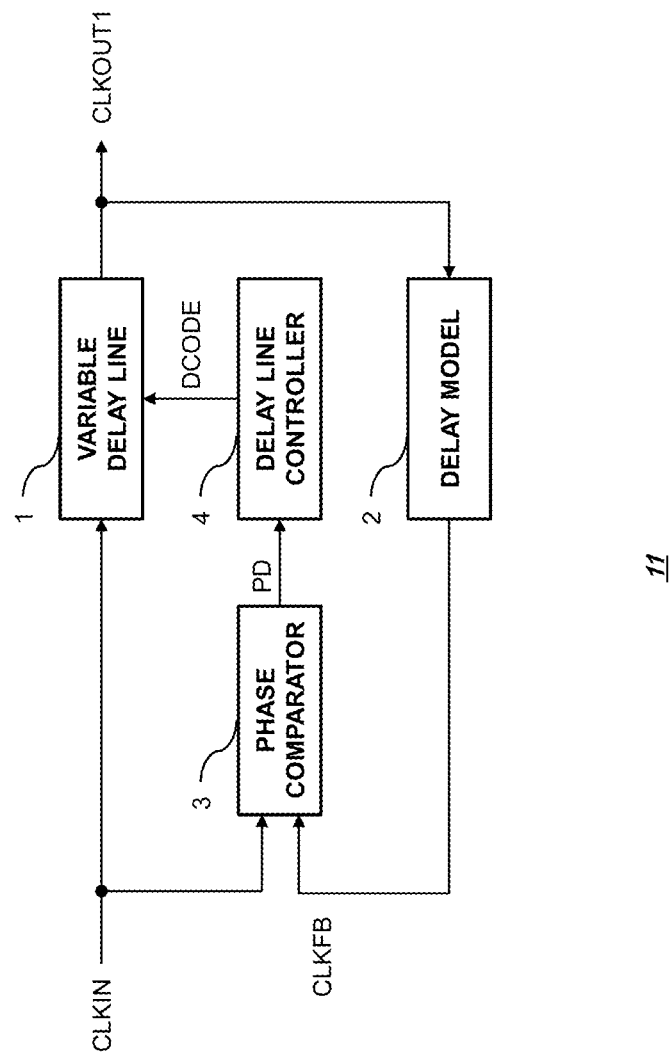
FIG. 2 is a block diagram illustrating a delay locked loop of FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
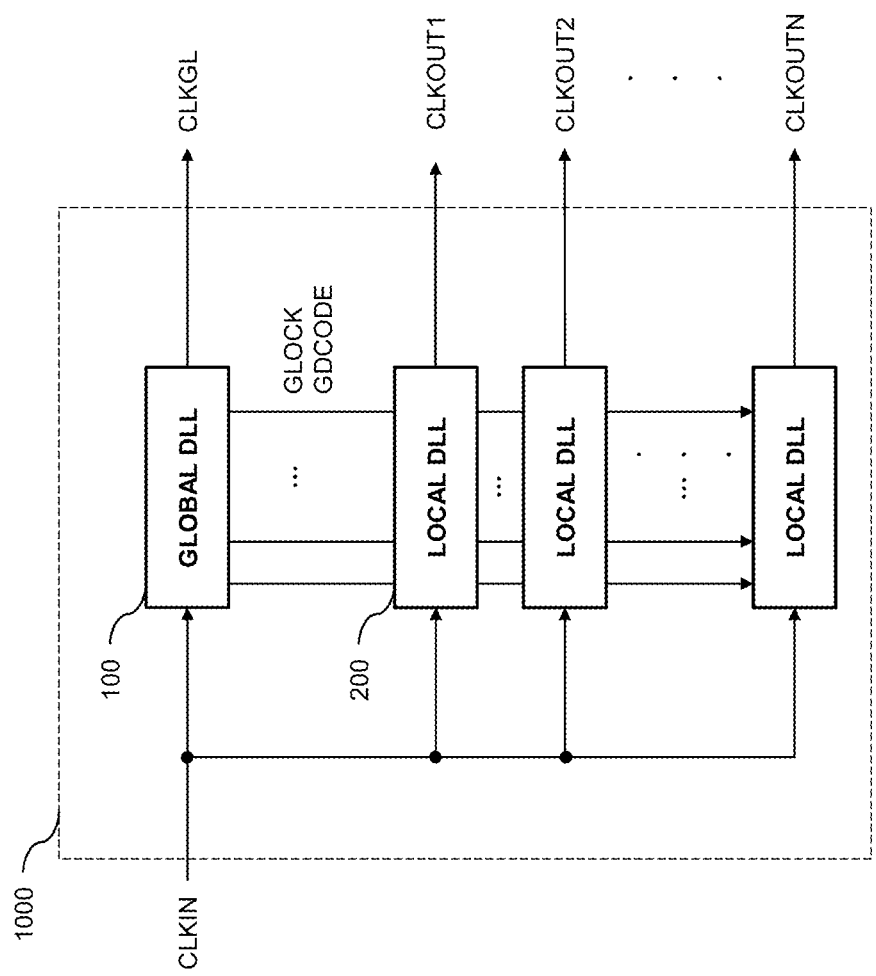
FIG. 3 is a block diagram illustrating a multi-channel delay locked loop in accordance with an embodiment of the present disclosure.

FIG. 3 is a block diagram illustrating a multi-channel delay locked loop 1000 in accordance with an embodiment of the present disclosure.

The multi-channel delay locked loop 1000 may include a global delay locked loop 100 and a plurality of local delay locked loops 200.

The global delay locked loop 100 may lock a delay between an input clock signal CLKIN and a global output clock signal CLKGL, and the local delay locked loops 200 may lock delays between the input clock signal CLKIN and output local output clock signals CLKOUT1, CLKOUT2, ..., CLKOUTN, respectively. The local output clock signal may be referred to as a 'channel clock signal.'

During an initial stage of a locking operation, the local delay locked loops 200 may not operate, but the global delay locked loop 100 may operate. When global locking is completed, the global delay locked loop 100 may activate a global locking signal GLOCK, and output a global delay control signal GDCODE. Then, the global delay locked loop 100 may stop the locking operation. Thus, power waste of the global delay locked loop 100 can be prevented.

The local delay locked loops 200 may start a local locking operation after the global locking is completed, and initialize a delay amount of a variable delay line therein according to the delay control signal GDCODE provided by the global delay locked loop 100. The local delay locked loops 200 may lock delays between the input clock signal CLKIN and the local output clock signals CLKOUT1, CLKOUT2, ..., and CLKOUTN, respectively.

In an embodiment, the local delay locked loops 200 may be distributed at different locations in a semiconductor device. In such a case, characteristics of the distributed local delay locked loops 200, such as temperature and process variations, may differ depending on their respective locations.

Thus, when the global delay control signal GDCODE is used as a local delay control signal LDCODE after the locking operation of the global delay locked loop 100 is completed, the respective local delay locked loops 200 may not be locked. Therefore, each of the local delay locked loops 200 needs to independently perform a locking operation.

Detailed configurations of the global delay locked loop 100 and the local delay locked loops 200 will be described below.

Figure 4:
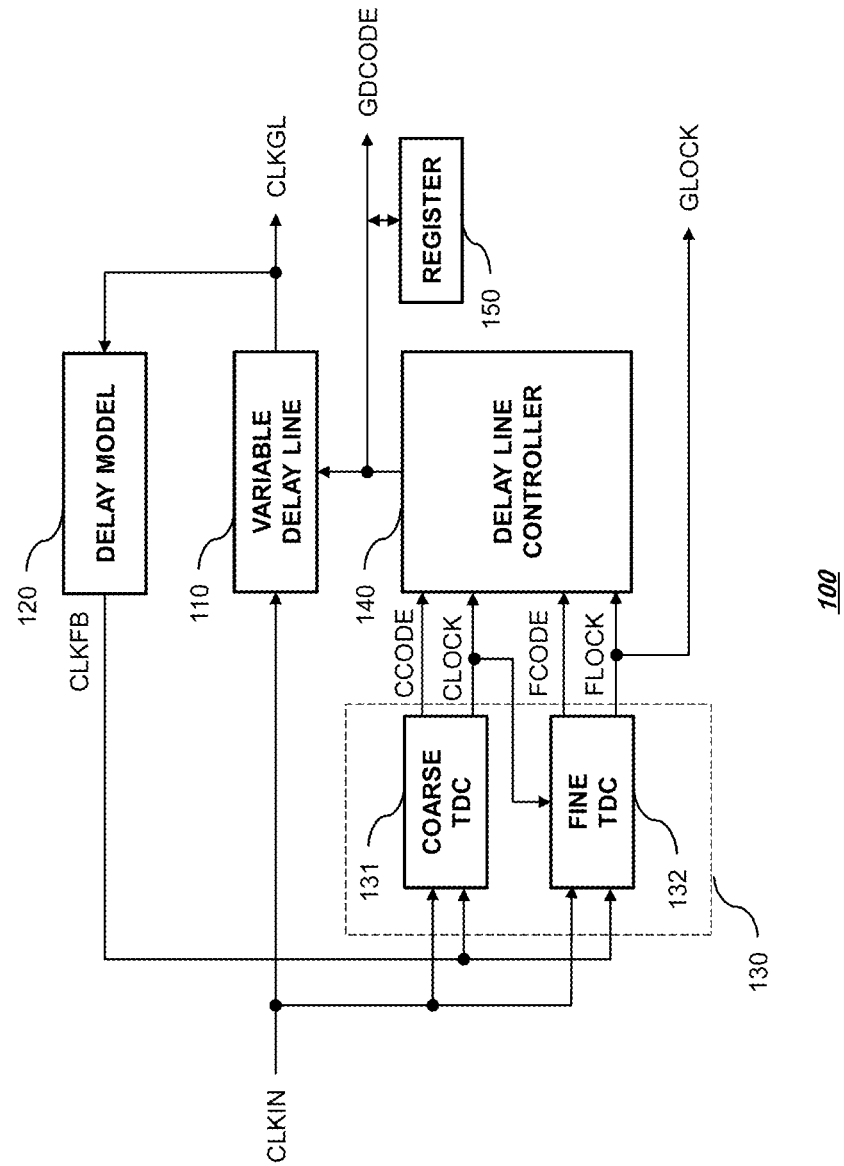
FIG. 4 is a block diagram illustrating a global delay locked loop of FIG. 3.

FIG. 4 is a block diagram illustrating the global delay locked loop 100 of FIG. 3.

The global delay locked loop 100 may include a variable delay line 110, a delay model 120, a phase comparator 130, and a delay line controller 140.

The variable delay line 110 may adjust a delay amount of the input clock signal CLKIN according to the global delay control signal GDCODE, and output the global output clock signal CLKGL. Since the variable delay line 110 may use a well-known variable delay line that adjusts a delay amount according to a delay control signal, detailed descriptions of the variable delay line 110 are omitted herein.

The delay model 120 may generate a feedback clock signal CLKFB by delaying the global output clock signal CLKGL according to a modeled delay time. If a phase difference between the global output clock signal GLKGL and the input clock signal CLKIN is intended to be set to 0, the delay model 120 may not be required.

The phase comparator 130 may compare the phase of the input clock signal CLKIN and the phase of the feedback clock signal CLKFB, and determine whether a delay between the clock signals CLKIN and CLKFB was locked.

In an embodiment of the present disclosure, the phase comparator 130 may include a time to digital converter (TDC). More specifically, the phase comparator 130 may include a coarse TDC 131 and a fine TDC 132.

Since technology for determining whether a delay between two clock signals was locked by checking a phase difference between two clock signals using a TDC is publicly known, detailed descriptions thereof are omitted herein.

The coarse TDC 131 may determine a phase difference between the input clock signal CLKIN and the feedback clock signal CLKFB, and output a coarse phase difference signal CCODE and a coarse locking signal CLOCK, the coarse locking signal CLOCK indicating whether the delay between the two clock signals CLKIN and CLKFB was locked.

The fine TDC 132 may determine a phase difference between the input clock signal CLKIN and the feedback clock signal CLKFB, and output a fine phase difference signal FCODE and a fine locking signal FLOCK, the fine locking signal FLOCK indicating whether the delay between the two clock signals CLKIN and CLKFB was locked.

The fine TDC 132 may determine whether the delay between the two clock signals CLKIN and CLKFB was locked in a narrower time range compared to the coarse TDC 131. The fine TDC 132 may start its operation after the coarse locking signal CLOCK is activated. The fine locking signal FLOCK may be output as the global locking signal GLOCK, and thus the global locking signal GLOCK may have the same logic level as the fine locking signal FLOCK.

The delay line controller 140 may generate the global delay control signal GDCODE based on the coarse phase difference signal CCODE and the fine phase difference signal FCODE.

When the global locking signal GLOCK is activated, the delay line controller 140 may retain a value of the global delay control signal GDCODE. When the global locking signal GLOCK is not activated, the delay line controller 140 may adjust the value of the global delay control signal GDCODE such that the delay amount of the variable delay line 110 is changed to satisfy the locking condition.

The global delay locked loop 100 may further include a register 150 to store the value of the global delay control signal GDCODE. The register 150 may be implemented separately from the global delay locked loop 100. In an embodiment, the register 150 may be located outside the global delay locked loop 100.

In such a case, even when power applied to the global delay locked loop 100 is cut off after the global locking is completed, power may be applied to the register 150 to retain the value of the global delay control signal GDCODE. The global locking signal GLOCK may be used as a switching control signal for determining whether to supply power to the respective units of the global delay locked loop 100.

Figure 5:
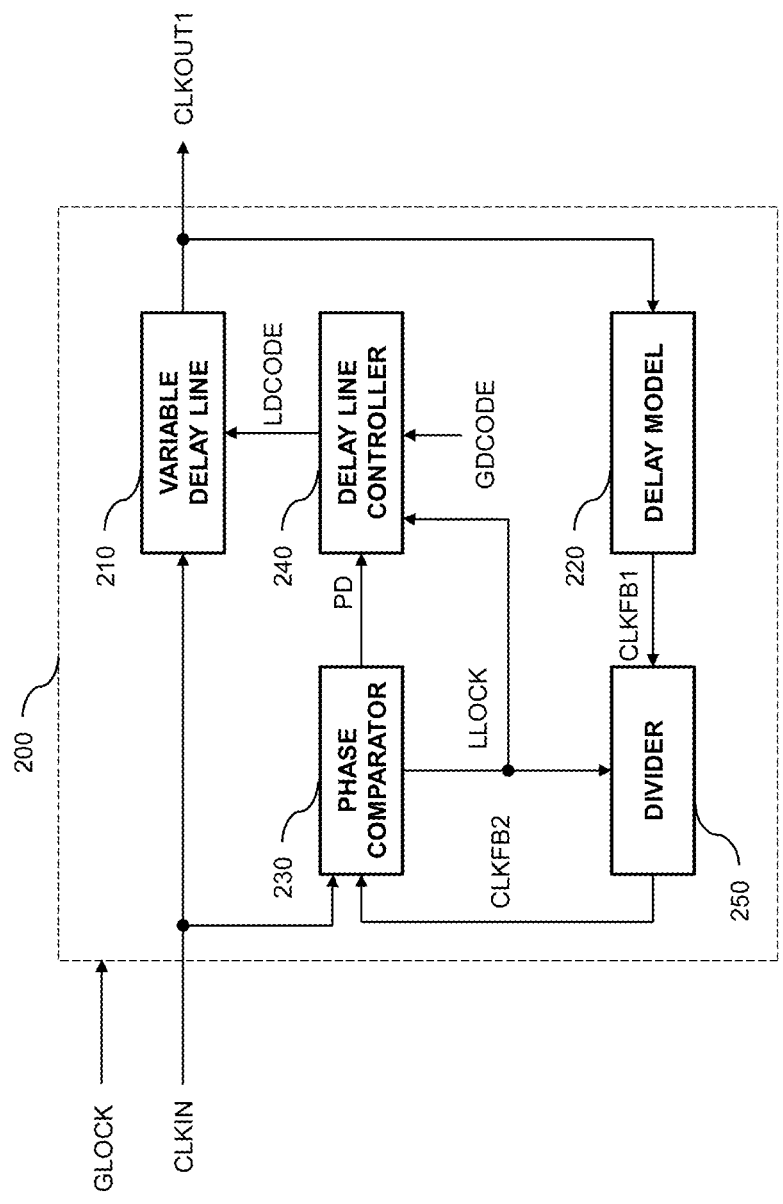
FIG. 5 is a block diagram illustrating a local delay locked loop of FIG. 3.

FIG. 5 is a block diagram illustrating the local delay locked loop 200 of FIG. 3.

The local delay locked loop 200 may include a variable delay line 210, a delay model 220, a phase comparator 230, a delay line controller 240, and a divider 250.

As described above, the local delay locked loop 200 may start its locking operation after the global locking is completed. The global locking signal GLOCK may be used as a switching control signal for determining whether to supply power to the respective units of the local delay locked loop 200. Hereafter, when the global locking signal GLOCK is activated, operations of the respective units of the local delay locked loop 200 will be described.

The variable delay line 210 may delay the input clock signal CLKIN according to a local delay control signal LDCODE, and output the local output clock signal, e.g., CLKOUT1.

The variable delay line 210 included in the local delay locked loop 200 may have substantially the same configuration as the variable delay line 110 included in the global delay locked loop 100.

During an initial stage of a locking operation of the local delay locked loop 200, the local delay control signal LDCODE may have the same value as the global delay control signal GDCODE. Thus, the input clock signal CLKIN and the local output clock signal CLKOUT1 may be set in a locking state or a state close to the locking state during the initial stage of the locking operation.

The delay model 220 may delay the local output clock signal CLKOUT1 by a modeled delay amount, and output a first feedback clock signal CLKFB1. The delay model 120 of the global delay locked loop 100 and the delay model 220 of the local delay locked loop 200 may have substantially the same delay amount. If the modeled delay amount is 0, that is, if the output clock signal CLKOUT1 and the input clocks signal CLKIN are in phase, the delay model 220 may not be required.

The divider 250 may divide the first feedback clock signal CLKFB1 according to a local locking signal LLOCK, and output a second feedback clock signal CLKFB2. The divider 250 may increase a division ratio when the local locking signal LLOCK is activated, and decrease the division ratio when the local locking signal LLOCK is deactivated. This operation will be described below in more detail.

The phase comparator 230 may compare a phase of the input clock signal CLKIN and a phase of the second feedback clock signal CLKFB2, and output a phase difference signal PD and the local locking signal LLOCK. As aforementioned, the divider 250 may control the division ratio according to the local locking signal LLOCK.

The delay line controller 240 may generate the local delay control signal LDCODE based on the global delay control signal GDCODE and the phase difference signal PD. The local delay control signal LDCODE may be initialized to the global delay control signal GDCODE during the initial stage of the locking operation of the local delay locked loop 200.

Figure 6:
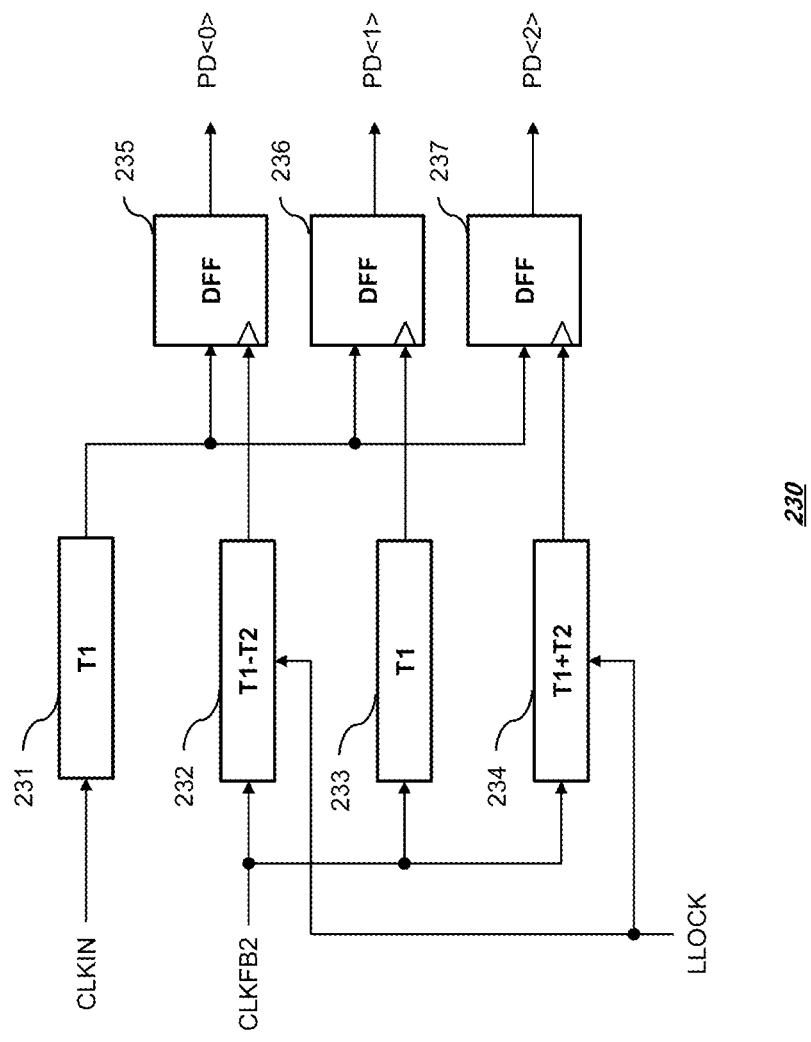
FIG. 6 is a block diagram illustrating a phase comparator of FIG. 5.

FIG. 6 is a block diagram illustrating the phase comparator 230 of FIG. 5.

In the present embodiment, the phase comparator 230 may compare the phase of the input clock signal CLKIN and the phase of the second feedback clock signal CLKFB2.

The phase comparator 230 may include first to fourth delay lines 231 to 234 and first to third D flip-flops 235 to 237.

The first delay line 231 may delay the input clock signal CLKIN, and the second to fourth delay lines 232 to 234 may delay the second feedback clock signal CLKFB2.

The first and third delay lines 231 and 233 may be set to have the same delay amount of T1 (T1>0), the second delay line 232 may be set to have a delay amount of T1−T2 (T2>0, T1≥T2), and the fourth delay line 234 may be set to have a delay amount of T1+T2.

The first D flip-flop 235 may latch a signal outputted from the first delay line 231 at a rising edge of a clock signal outputted from the second delay line 232.

The second D flip-flop 236 may latch the signal outputted from the first delay line 231 at a rising edge of a clock signal outputted from the third delay line 233.

The third D flip-flop 237 may latch the signal outputted from the first delay line 231 at a rising edge of a clock signal outputted from the fourth delay line 234.

FIG. 7 is a timing diagram illustrating the operation of the phase comparator 230 of FIG. 6.

As illustrated in FIG. 7, when a rising edge of the input clock signal CLKIN and a rising edge of the second feedback clock signal CLKFB2 are located within a window of 2×T2, the local locking signal LLOCK may be activated. Otherwise, the local locking signal LLOCK may be deactivated.

Figure 7A:
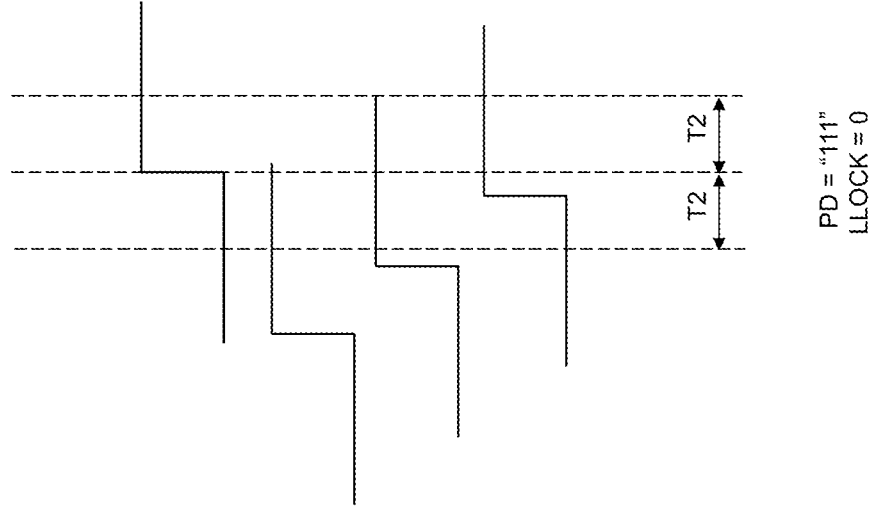
FIGS. 7(A) and 7(B) are timing diagrams illustrating operations of the phase comparator of FIG. 6.

When the rising edge of the input clock signal CLKIN and the rising edge of the second feedback clock signal CLKFB2 occur within the window of 2×T2, i.e., the local locking signal LLOCK is activated, zeroth and second bits of the phase difference signal PD may have different values, e.g., '0' and '1', as illustrated in FIG. 7(A).

Referring back to FIG. 6, the delay amount T2 in the first to fourth delay lines 231 to 234 may change according to the local locking signal LLOCK. For example, the first to fourth delay lines 231 to 234 may increase the delay amount T2 when the local locking signal LLOCK is activated.

In this case, although a phase difference between the input clock signal CLKIN and the second feedback clock signal CLKFB2 occurs due to noise such as bang-bang jitter, the local locking state can be maintained to prevent an unnecessary feedback control operation, which makes it possible to reduce power consumption.

In FIG. 5, when the local locking signal LLOCK is activated and thus the zeroth and second bits of the phase difference signal PD are different from each other as illustrated in FIG. 7(A), the delay line controller 240 may retain a value of the local delay control signal LDCODE. On the other hand, when the local locking signal LLOCK is deactivated and thus the zeroth and second bits of the phase difference signal PD are equal to each other as illustrated in FIG. 7(B), the delay line controller 240 may change the value of the local delay control signal LDCODE such that the delay amount of the variable delay line 210 is increased or decreased according to the phase difference signal PD.

Figure 7B:
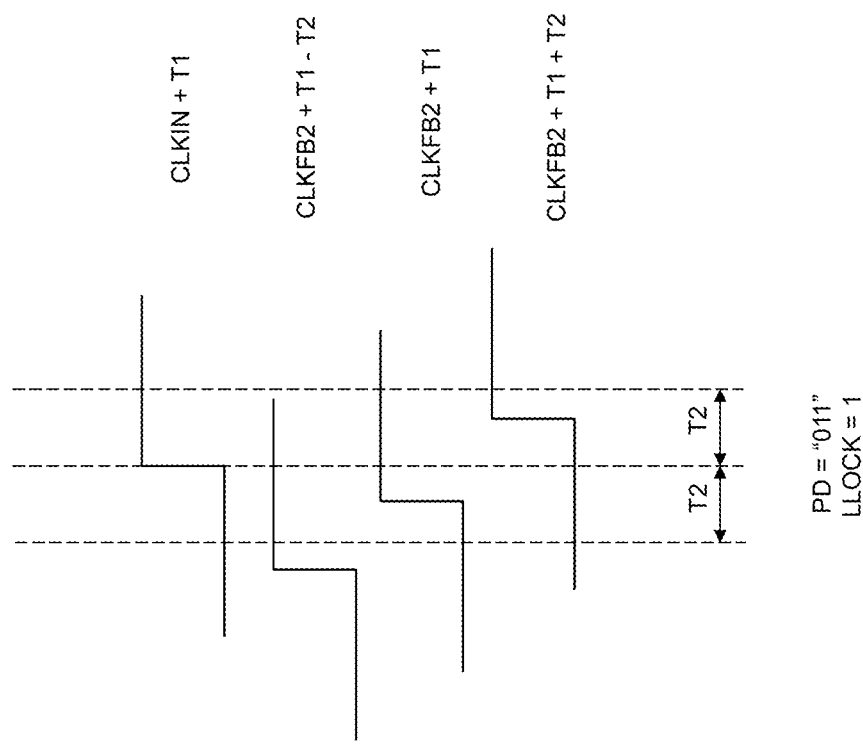

For example, when the zeroth and second bits of the phase difference signal PD are equal to 1 as illustrated in FIG. 7(B), the delay line controller 240 may adjust the value of the local delay control signal LDCODE in order to decrease the delay amount of the variable delay line 210. Furthermore, when the zeroth and second bits of the phase difference signal PD are equal to 0, the delay line controller 240 may adjust the value of the local delay control signal LDCODE in order to increase the delay amount of the variable delay line 210.

Referring back to FIG. 5, the divider 250 may change the division ratio according to whether the local locking signal LLOCK is activated or deactivated.

For example, when the local locking signal LLOCK is activated, the divider 250 may set the division ratio to a larger value than when the local locking signal LLOCK is deactivated, thereby lowering a frequency of the second feedback clock signal CLKFB2.

As illustrated in FIG. 6, the output PD of the phase comparator 230 may be changed at the rising edge of the second feedback clock signal CLKFB2. Thus, when the local locking signal LLOCK is activated, the frequency of the second feedback clock signal CLKFB2 is lowered, and thus the value of the phase difference signal PD may be changed less frequently than when the local locking signal LLOCK is deactivated. Thus, after the local locking is completed, the feedback control operation can be less frequently performed to reduce power consumption.

In accordance with the embodiments of the present invention, the multi-channel delay locked loop may be configured in a hierarchical fashion using the global delay locked loop and the plurality of local delay locked loops which operate at a high speed. Thus, the multi-channel delay locked loop can reduce a time required for locking, and reduce the occupied area, thereby reducing power consumption.

Furthermore, the local delay locked loop may dynamically control a phase comparison count and margin required for phase comparison depending on whether locking was completed or not. Thus, the local delay locked loop may reduce the influence caused by jitter, thereby performing a stable locking operation and reducing power consumption.

Although various embodiments have been described for illustrative purposes, it will be apparent to those skilled in the art that various changes and modifications may be made without departing from the spirit and scope of the invention as defined in the following claims.

What is claimed is:

1. A multi-channel delay locked loop comprising:
a global delay locked loop configured to lock an input clock signal and output a global delay control signal corresponding to a delay amount of the input clock signal during a locking operation; and
a plurality of local delay locked loops each configured to output a channel clock signal by locking the input clock signal, and initialize the delay amount of the input clock signal according to the global delay control signal,
wherein when the locking operation of the global delay locked loop is completed, the global delay locked loop locks a value of the global delay control signal and each of the plurality of local delay locked loops starts its locking operation with the delay amount of the input clock signal initialized with the global delay control signal that is locked by the global delay locked loop.

2. The multi-channel delay locked loop of claim 1, further comprising a register configured to store the global delay control signal during the locking operation of the global delay locked loop.

3. The multi-channel delay locked loop of claim 1, wherein the global delay locked loop comprises:
a variable delay line configured to adjust the delay amount of the input clock signal according to the global delay control signal;
a phase comparator configured to compare a phase of a feedback clock signal to a phase of the input clock signal, the feedback clock signal being fed back from an output signal of the variable delay line; and
a delay line controller configured to control the value of the global delay control signal according to an output of the phase comparator.

4. The multi-channel delay locked loop of claim 3, wherein the global delay locked loop further comprises a delay model configured to output the feedback clock signal by delaying the output signal of the variable delay line.

5. The multi-channel delay locked loop of claim 3, wherein the phase comparator comprises a time to digital converter (TDC) configured to compare the phase of the feedback clock signal and the phase of the input clock signal.

6. The multi-channel delay locked loop of claim 5, wherein the phase comparator comprises:

a coarse TDC configured to compare the phase of the feedback clock signal and the phase of the input clock signal and output a coarse locking signal; and
a fine TDC configured to compare the phase of the feedback clock signal and the phase of the input clock signal in response to the coarse locking signal.

7. The multi-channel delay locked loop of claim 6, wherein the fine TDC starts an operation after the coarse TDC determines that the feedback clock signal and the input clock signal were locked and the coarse TDC activates the coarse locking signal.

8. The multi-channel delay locked loop of claim 1, wherein each of the local delay locked loops comprises:
a local variable delay line configured to adjust the delay amount of the input clock signal according to a local delay control signal;
a local phase comparator configured to compare a phase of a second feedback clock signal to a phase of the input clock signal, the second feedback clock signal being fed back from an output signal of the local variable delay line; and
a local delay line controller configured to control a value of the local delay control signal according to an output of the local phase comparator.

9. The multi-channel delay locked loop of claim 8, wherein the local delay locked loop further comprises a divider configured to output the second feedback clock signal by dividing a first feedback clock signal fed back from the output signal of the local variable delay line.

10. The multi-channel delay locked loop of claim 9, wherein the divider has a division ratio which changes depending on whether locking of the local delay locked loop was completed or not.

11. The multi-channel delay locked loop of claim 9, wherein the local delay locked loop further comprises a delay model configured to delay the output signal of the local variable delay line and provide the delayed signal to the divider.

12. The multi-channel delay locked loop of claim 8, wherein a phase difference signal outputted from the local phase comparator indicates whether rising edges of the input clock signal and the second feedback clock signal occur within a predetermined time range.

13. The multi-channel delay locked loop of claim 12, wherein when the rising edges of the input clock signal and the second feedback clock signal occur within the predetermined time range, the local phase comparator changes the predetermined time range.

14. The multi-channel delay locked loop of claim 8, wherein the local phase comparator comprises:
a first delay line configured to delay the input clock signal by a period of time T1 (T1>0);
a second delay line configured to delay the second feedback clock signal by a period of time T1−T2 (T2>0, T1≥T2);
a third delay line configured to delay the second feedback clock signal by the period of time T1;
a fourth delay line configured to delay the second feedback clock signal by a period of time T1+T2;
a first flip-flop configured to latch an output of the first delay line at a rising edge of an output of the second delay line;
a second flip-flop configured to latch the output of the first delay line at a rising edge of an output of the third delay line; and a third flip-flop configured to latch the output of the first delay line at a rising edge of an output of the fourth delay line.

15. The multi-channel delay locked loop of claim 14, wherein when the output of the first flip-flop and the output of the third flip-flop have different values, a period of time T2 is changed.

* * * * *